United States Patent
Lee (10) Patent No.: US 11,475,976 B2
(45) Date of Patent: Oct. 18, 2022

(54) LATCH CIRCUIT AND SEMICONDUCTOR MEMORY DEVICE INCLUDING THE SAME

(71) Applicant: SK hynix Inc., Gyeonggi-do (KR)

(72) Inventor: Jeong Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 54 days.

(21) Appl. No.: 17/094,075

(22) Filed: Nov. 10, 2020

(65) Prior Publication Data
US 2021/0375388 A1 Dec. 2, 2021

(30) Foreign Application Priority Data
May 29, 2020 (KR) .......... 10-2020-0065135

(51) Int. Cl.
G11C 29/00 (2006.01)
G11C 11/4072 (2006.01)
G11C 7/10 (2006.01)
G11C 7/20 (2006.01)

(52) U.S. Cl.
CPC .......... *G11C 29/789* (2013.01); *G11C 7/1006* (2013.01); *G11C 7/20* (2013.01); *G11C 11/4072* (2013.01); *G11C 29/787* (2013.01)

(58) Field of Classification Search
CPC ....... G11C 29/789; G11C 7/1006; G11C 7/20; G11C 11/4072; G11C 29/787
See application file for complete search history.

(56) References Cited

U.S. PATENT DOCUMENTS

| | | | |
|---|---|---|---|
| 6,509,598 B2 | 1/2003 | Okuda | |
| 9,437,330 B2* | 9/2016 | Park | G11C 7/20 |
| 10,020,074 B1* | 7/2018 | Jeong | H01L 27/12 |
| 10,770,154 B2* | 9/2020 | Yu | G11C 5/143 |
| 11,017,878 B1* | 5/2021 | Lu | G11C 17/16 |
| 2018/0090227 A1* | 3/2018 | Lee | G11C 7/10 |
| 2021/0124659 A1* | 4/2021 | Ryu | G06F 12/0238 |

FOREIGN PATENT DOCUMENTS

KR 10-2009-0105012 10/2009

* cited by examiner

*Primary Examiner* — Tri M Hoang
(74) *Attorney, Agent, or Firm* — IP & T Group LLP (57) ABSTRACT

A latch circuit includes a plurality of latch sets, each including an enable latch and a plurality of address latches; and a plurality of latch-width adjusting circuits respectively corresponding to the latch sets, wherein, in each of the plurality of latch sets, the corresponding latch-width adjusting circuit is disposed between the enable latch of the corresponding latch set and the address latch adjacent to the enable latch, and couples the enable latch to the adjacent address latch depending on whether or not the corresponding latch set is used, at an end of a boot-up operation.

18 Claims, 6 Drawing Sheets

LATCH CIRCUIT AND SEMICONDUCTOR MEMORY DEVICE INCLUDING THE SAME

CROSS-REFERENCE TO RELATED APPLICATION

This application claims priority under 35 U.S.C. § 119(a) to Korean Patent Application No. 10-2020-0065135, filed on May 29, 2020, the disclosure of which is incorporated herein by reference in its entirety.

BACKGROUND

1. Field

Various embodiments of the present invention generally relate to a semiconductor design technique, and more particularly to a semiconductor memory device for transferring data from a non-volatile memory to a latch circuit.

2. Description of the Related Art

In general, a semiconductor memory device is additionally equipped with spare memory cells (redundant cells) for replacing defective memory cells, which are incapable of operating in normal conditions due to defects in the memory cell array of the device. Replacing defective memory cells in this way is for the purpose of enhancing product yield.

For this, a semiconductor memory device includes a fuse circuit for programming one or more repair addresses corresponding to the redundant cells and the defective cells, and storing the repair address(es) programmed into the fuse circuit in a latch circuit as repair information during a boot-up operation. The semiconductor memory device may compare an external address and the repair information stored in the latch circuit during a normal operation. Further, the semiconductor memory device may perform a repair operation for accessing a corresponding redundant cell instead of a defective cell assigned by the external address when the external address is identical to the repair information.

The latch circuit is vulnerable to soft errors in which stored values change due to particles caused by radioisotopes (neutrons). During or after the boot-up operation, a latch inversion occurs when the latch circuit is reset or when the repair information stored in the latch circuit is changed, due to a soft error. Due to this phenomenon, the latch circuit loses the stored repair information, which may cause malfunction when the semiconductor memory device performs a repair operation.

SUMMARY

Various embodiments of the present invention are directed to a semiconductor memory device capable of adjusting a width of a latch circuit by coupling an enable fuse and address fuses of an unused latch set in the latch circuit, after a boot-up or power-up operation.

In accordance with an embodiment of the present invention, a latch circuit includes: a plurality of latch sets, each including an enable latch and a plurality of address latches; and a plurality of latch-width adjusting circuits respectively corresponding to the latch sets, wherein, in each of the plurality of latch sets, the corresponding latch-width adjusting circuit is disposed between the enable latch of the corresponding latch set and the address latch adjacent to the enable latch, and couples the enable latch to the adjacent address latch depending on whether or not the corresponding latch set is used, at an end of a boot-up operation.

In accordance with an embodiment of the present invention, a semiconductor memory device includes: a memory cell array including normal memory cells and redundant memory cells to replace repair target memory cells; a non-volatile memory including a plurality of fuse sets for programming repair addresses of the repair target memory cells, suitable for sequentially outputting fuse data programmed in the fuse sets in response to a boot-up signal; a latch circuit including a plurality of latch sets respectively corresponding to the fuse sets, suitable for storing the fuse data provided from the respective fuse sets into the latch sets, and outputting the stored fuse data as repair information while adjusting a width of unused latch sets among the latch sets in response to a boot-up completion signal; and a repair control circuit suitable for controlling a repair operation for replacing the repair target memory cells with the redundant memory cells, based on the repair information.

In accordance with an embodiment of the present invention, a latch circuit includes: a first latch suitable for transferring first data to a first node and inverted first data to a second node, in response to a selection signal that is enabled during a power-up operation, and latching data at the first and second nodes; a second latch suitable for transferring second data to a third node and inverted second data to a fourth node, in response to the selection signal, and latching data at the third and fourth nodes; and a latch-width adjusting circuit suitable for coupling the first node to the third node and coupling the second node to the fourth node, in response to the data at the second node and a completion signal that is enabled after the power-up operation.

In accordance with an embodiment of the present invention, a semiconductor memory device includes: a plurality of fuse sets suitable for programming repair addresses of repair target memory cells as fuse data and outputting the fuse data in each fuse set, in response to a boot-up signal; a plurality of latch sets, each latch set corresponding to each fuse set and suitable for receiving and storing fuse data from the corresponding fuse set and outputting the stored fuse data as repair information; and a repair control circuit suitable for controlling a repair operation on repair target memory cells based on the repair information, wherein each latch set includes: an enable latch suitable for storing information indicating whether the latch set stores valid fuse data; a plurality of address latches including a first address latch adjacent to the enable latch and remaining address latches in parallel, suitable for storing the fuse data; and a latch-width adjusting circuit suitable for coupling the enable latch and the first address latch when the latch set is unused and a boot-up completion signal is enabled.

These and other features and advantages of the present invention will be better understood by those with ordinary skill in the field of the invention from the following detailed description of various embodiments of the invention in conjunction with the accompanying drawings.

DETAILED DESCRIPTION

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to describe various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, various embodiments of the present invention are described in detail with reference to the attached drawings.

Figure 1:
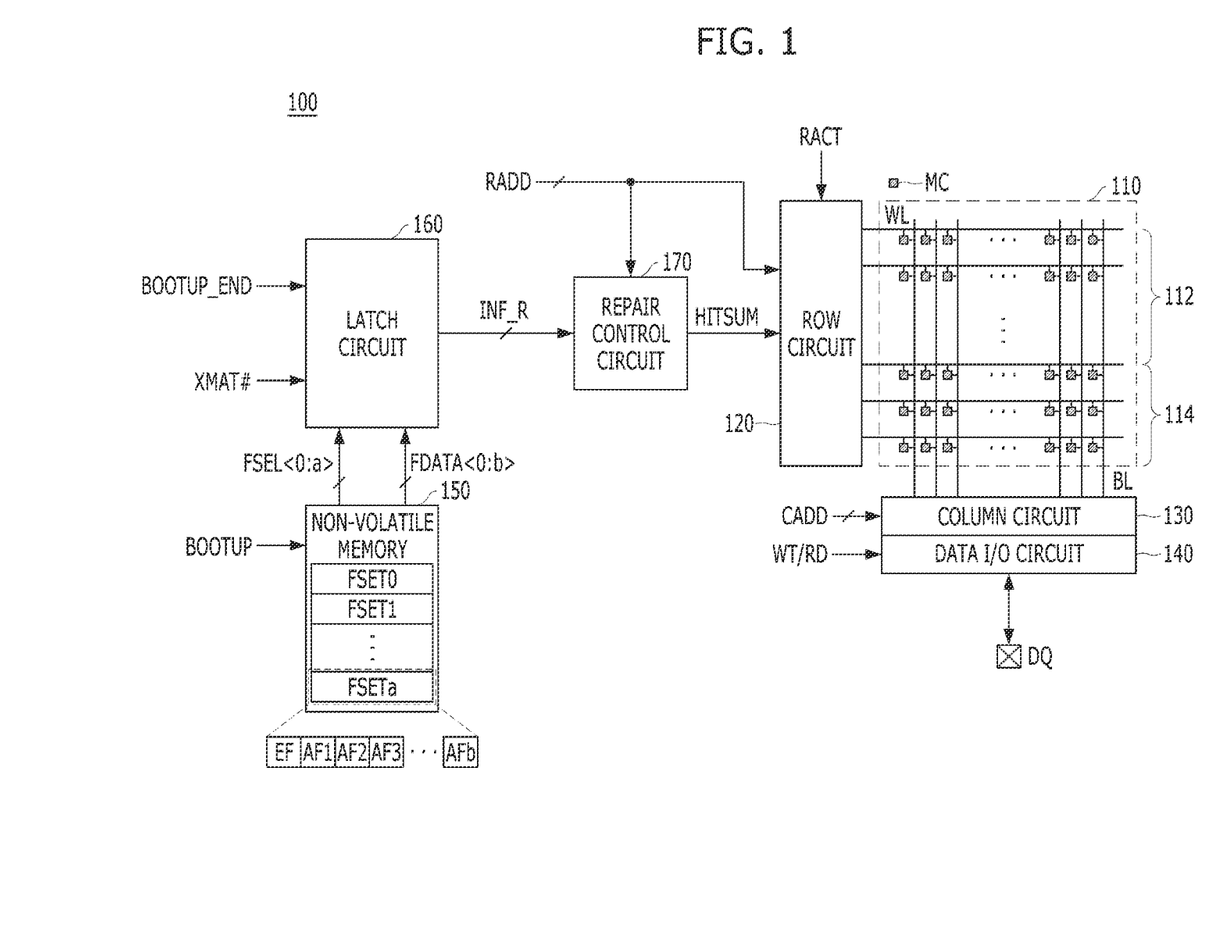
FIG. 1 is a block diagram illustrating a configuration of a semiconductor memory device including a latch circuit in accordance with an embodiment of the present invention.
Figure 2:
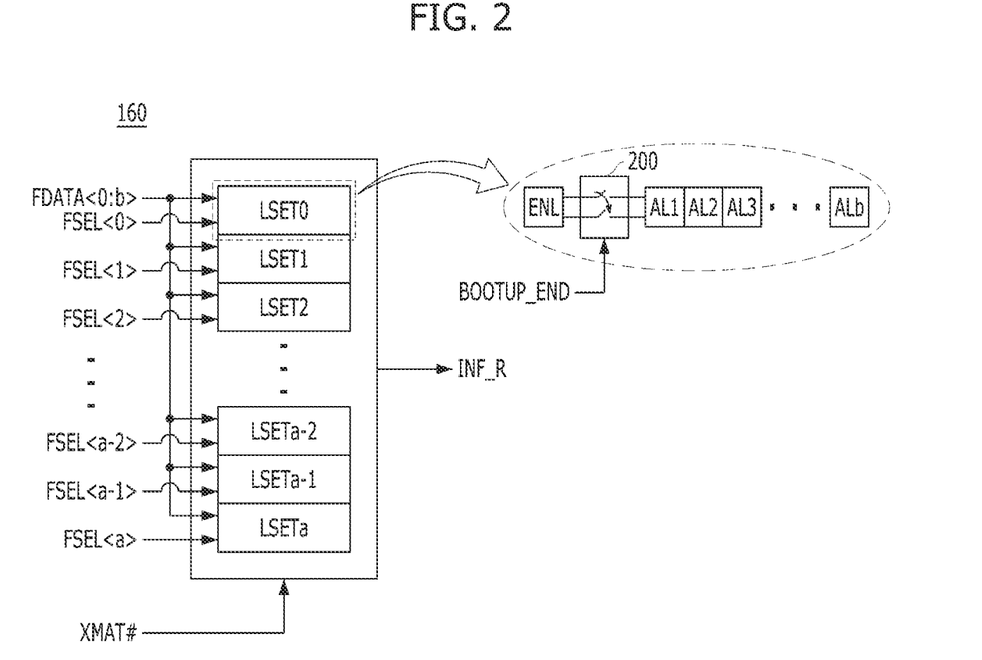
FIG. 2 is a diagram illustrating a latch circuit, such as that of FIG. 1.

FIG. 1 is a block diagram illustrating a configuration of a semiconductor memory device 100 including a latch circuit 160 in accordance with an embodiment of the present invention. FIG. 2 is a diagram illustrating the latch circuit 160 of FIG. 1.

Referring to FIG. 1, the semiconductor memory device 100 may include a memory cell area 110, a row circuit 120, a column circuit 130, a data input/output (I/O) circuit 140, a non-volatile memory 150, a latch circuit 160, and a repair control circuit 170.

The semiconductor memory device 100 may include a command decoder (not shown) and an active signal generator (not shown). The command decoder may generate a refresh signal REF (not shown), a write signal WT, a read signal RD, an active signal ACT (not shown), and a precharge signal PCG (not shown) by decoding external commands RST, /CS, /RAS, /CAS, and /WE (not shown) that are inputted from an external source. The active signal generator may generate a row active signal RACT in response to the active signal ACT and the precharge signal PCG. Also, the semiconductor memory device 100 may include an address buffer (not shown) for buffering an externally input address and outputting a row address RADD and a column address CADD, and an address decoder (not shown) for generating a mat activation signal XMAT # according to the row address RADD.

The memory cell area 110 may include a plurality of memory cells MC each for storing data. The memory cells MC may be coupled to the row circuit 120 through word lines WL, and coupled to the column circuit 130 through bit lines BL. Data may be stored in the memory cells that are selected based on a word line activation signal outputted from the row circuit 120 and a column selection signal outputted from the column circuit 130. According to an embodiment, the memory cell area 110 may be formed of volatile memory cells. Preferably, the memory cell area 110 is formed of dynamic random access memory (DRAM) memory cells.

The memory cell area 110 may include a normal cell region 112 where normal memory cells are disposed, and a redundancy cell region 114 where redundant memory cells are disposed. When a defective memory cell, which may be also called a repair target memory cell, is detected in the normal cell region 112, the normal word line (repair target word line) in which the defective memory cell is located may be replaced with a redundant word line of the redundancy cell region 114.

The non-volatile memory 150 may include a plurality of fuse sets FSET0 to FSETa for programming addresses (repair addresses) of the repair target memory cells. Each of the fuse sets FSET0 to FSETa may include an enable fuse EF and a plurality of address fuses AF1 to AFb.

The enable fuse EF may program information on whether a corresponding fuse set stores a valid repair address. For example, when the enable fuse EF is programmed by a high bit, it is determined that the corresponding fuse set stores the valid repair address. The address fuses AF1 to AFb may program respective bits of the repair address, and include a fuse cell for each bit of the repair address. For example, when a 5-bit row address RADD is configured, each of the fuse sets FSET0 to FSETa includes first to fifth address fuses AF1 to AF5. When the corresponding fuse set is unused, the enable fuse EF and the address fuses AF1 to AFb may be programmed by a low bit.

The non-volatile memory 150 may include any of various types of memories, such as an array e-fuse (ARE) circuit, a laser fuse circuit, a NAND flash memory, a NOR flash memory, a phase-change random access memory (PCRAM), a resistive random access memory (ReRAM), a ferroelectric random access memory (FeRAM), a magnetic random access memory (MRAM), and/or a spin transfer magnetic random access memory (STT-MRAM). Hereinafter, an arrangement in which the non-volatile memory 150 includes an ARE circuit is explained as an example.

The non-volatile memory 150 may output the repair addresses programmed therein as fuse data FDATA<0:b> to the latch circuit 160 in response to a boot-up signal BOOTUP. At this time, the non-volatile memory 150 may provide a selection signal FSEL<0:a> together with the fuse data FDATA<0:b>, to the latch circuit 160. By way of example, in the following embodiment, the semiconductor memory device operates in response to the boot-up signal BOOTUP associated with a boot-up operation. In an embodiment, the semiconductor memory device may operate in response to a power-up signal related to an initialization operation, such as a power-up operation.

The latch circuit 160 may include a plurality of latch sets (not shown) that respectively correspond to the fuse sets FSET0 to FSETa. The latch circuit 160 may sequentially store the fuse data FDATA<0:b> provided from the respective fuse sets FSET0 to FSETa into the latch sets, in response to the selection signal FSEL<0:a>.

Referring to FIG. 2, the latch circuit 160 may include the latch sets LSET0 to LSETa respectively corresponding to the fuse sets FSET0 to FSETa. For example, the latch circuit 160 may include (a+1) latch sets LSET0 to LSETa respectively corresponding to (a+1) fuse sets FSET0 to FSETa, and the non-volatile memory 150 may provide the selection signal FSEL<0:a> having (a+1) bits to the latch circuit 160, so as to store the fuse data FDATA<0:b> to the corresponding one of the (a+1) latch sets LSET0 to LSETa. The latch sets LSET0 to LSETa may store the fuse data FDATA<0:b> in response to the respective bits of the selection signal FSEL<0:a>. For example, a first latch set LSET0 may store the fuse data FDATA<0:b> in response to a first bit FSEL<0> (first selection signal FSEL<0>) of the selection signal FSEL<0:a>.

Figure 3:
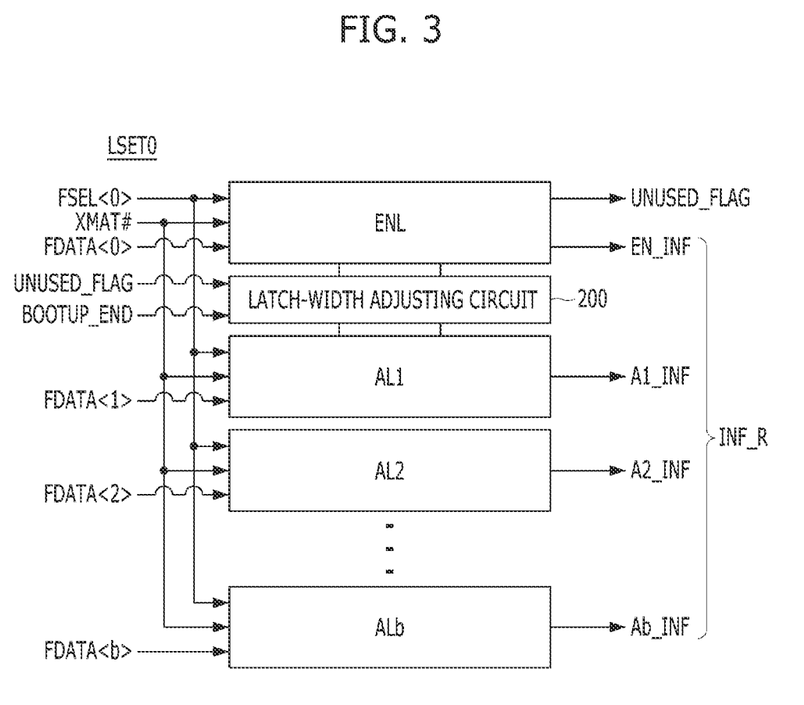
FIG. 3 is a block diagram illustrating a first latch set in accordance with an embodiment of the present invention.

As shown in FIG. 3, each of the latch sets LSET0 to LSETa may include an enable latch ENL and a plurality of address latches AL1 to ALb. The enable latch ENL may store fuse data corresponding to the enable fuse EF, i.e., may store information on whether a corresponding latch set stores a valid fuse data. For example, when the enable latch ENL stores a high bit, it is determined that the corresponding latch set stores the valid fuse data. The address latches AL1 to ALb may store fuse data corresponding to the address fuses AF1 to AFb, and include latch cells whose number corresponds to the bit number of the repair address. For example, when a 5-bit row address RADD is configured, the latch sets LSET0 to LSETa includes first to fifth address latches AL1 to Alb, respectively.

The latch circuit 160 may output the stored fuse data as repair information INF_R to the repair control circuit 170, according to the mat activation signal XMAT #. For reference, the memory cell area 110 may be divided into a plurality of cell matrices (cell mats), and each cell mat may be selected in response to the corresponding mat activation signal XMAT #. A set number of redundant word lines may be disposed in each cell mat, and the fuse sets FSET0 to FSETa and the latch sets LSET0 to LSETa may be allocated to the redundant word lines such that each cell mat includes dedicated fuse and latch sets. For example, assuming that one redundant word line is assigned to each of first to eighth cell mats, a first fuse set FSET0 and a first latch set LSET0 may be allocated to the redundant word line disposed in the first cell mat, and a second fuse set FSET1 and a second latch set LSET1 may be allocated to the redundant word line disposed in the second cell mat. In this way, an eighth fuse set FSET7 and an eighth latch set LSET7 may be allocated to the redundant word line disposed in the eighth cell mat. Accordingly, when the mat activation signal XMAT # to select a particular cell mat (e.g., the first cell mat) is enabled according to the row address RADD, the latch circuit 160 may provide the stored fuse data from the first fuse set FSET0 and the first latch set LSET0, as the repair information INF_R to the repair control circuit 170.

Further, the latch circuit 160 may include a plurality of latch-width adjusting circuits 200 corresponding to the latch sets LSET0 to LSETa. Each of the latch-width adjusting circuits 200 may be disposed between the enable latch ENL of the corresponding latch set and the address latch (i.e., the first address latch AL1) adjacent to the enable latch ENL. Each of the latch-width adjusting circuits 200 may couple the enable latch ENL to the adjacent address latch AL1 depending on whether the corresponding latch set is used or not, when a boot-up completion signal BOOTUP_END is enabled. The boot-up completion signal BOOTUP_END is enabled when or after the boot-up operation is finished. In some embodiments, each of the latch-width adjusting circuits 200 may couple the enable latch ENL to the adjacent address latch AL1 when the corresponding latch set is unused at an end of the boot-up operation. As a result, it may have an effect of increasing a width of the latch circuit 160. That is, the physical width of the latch circuit 160 may be adjusted depending on whether or not a latch set is used. The latch circuit 160 may adjust a width of unused latch sets among the latch sets LSET0 to LSETa in response to the boot-up completion signal BOOTUP_END. In accordance with an embodiment, a neutron attack is distributed due to an increase in the width of the unused latch sets, to thereby prevent latch inversion and lower the neutron soft error rate (NSER). The detailed configuration and operation of the latch circuit 160 is explained with reference to FIGS. 3 and 4.

Referring back to FIG. 1, the repair control circuit 170 may control the row circuit 120 to perform a repair operation, according to the repair information INF_R provided from the latch circuit 160. The repair control circuit 170 may compare the repair information INF_R with the externally input row address RADD, and output a repair control signal HITSUM based on the comparison result. If the row address RADD is to the same as the repair information INF_R, the redundancy control circuit 170 may enable the repair control signal HITSUM.

The row circuit 120 may activate a word line that is selected based on the row address RADD in response to the row active signal RACT. When the repair control signal HITSUM is enabled, the row circuit 120 may activate a redundant word line instead of the word line selected by the row address RADD. In this way, the repair target word line corresponding to the repair information INF_R stored in the latch circuit 160 may be replaced with the redundant word line.

The column circuit 130 may access data of a bit line BL that is selected based on the column address CADD.

During a read operation, the data I/O circuit 140 may output the data transferred from the bit line BL selected based on the column address CADD to data pads DQ in response to the read signal RD. During a write operation, the data I/O circuit 140 may transfer data inputted through the data pads DQ to a bit line BL corresponding to the column address CADD in response to the write signal WT.

As described above, in the semiconductor memory device 100, the non-volatile memory 150 may program the repair addresses in its fuse sets, and output the repair information INF_R to the latch circuit 160 in response to the boot-up signal BOOTUP. Herein, the repair information INF_R stored in the non-volatile memory 150 are not directly used but the repair information INF_R are moved into and stored in the latch circuit 160 and then used. The reason is as follows.

Since the non-volatile memory 150 is formed as an array type, it takes a set amount of time to call out the data stored therein. Since it is impossible to instantly read out the data from the non-volatile memory 150, it is impossible to perform a repair operation by directly using the data stored in the non-volatile memory 150. Therefore, the boot-up operation where the repair information INF_R stored in the non-volatile memory 150 are transferred to and stored in the latch circuit 160 is performed, and then after the boot-up operation, the repair operation may be performed using the data stored in the latch circuit 160.

Hereinafter, referring to FIGS. 3 and 4, configuration and operation of the latch circuit 160 is explained in detail. Each of latch sets LSET0 to LSETa may have substantially the same configuration and operation; thus, the first latch set LSET0 is described as an example.

FIG. 3 is a block diagram illustrating the first latch set LSET0 in accordance with an embodiment of the present invention.

Referring to FIG. 3, the first latch set LSET0 may include the enable latch ENL and the address latches AL1 to ALb. The latch-width adjusting circuit 200 may be disposed between the enable latch ENL and the first address latch AL1 adjacent to the enable latch ENL.

The enable latch ENL and the address latches AL1 to ALb may store the fuse data FDATA<0:b> in response to the first selection signal FSEL<0>, and output the repair information INF_R in response to the mat activation signal XMAT #. For example, the enable latch ENL may store a first bit FDATA<0> of the fuse data FDATA<0:b> according to the first selection signal FSEL<0>, and output the stored fuse data as enable information EN_INF according to the mat activation signal XMAT #. The first address latch AL1 may store a second bit FDATA<1> of the fuse data FDATA<0:b> according to the first selection signal FSEL<0>, and output the stored fuse data as address information A1_INF according to the mat activation signal XMAT #. The enable information EN_INF and the address information A1_INF to Ab_INF outputted from the enable latch ENL and the address latches AL1 to ALb, may configure the repair information INF_R. Further, the enable latch ENL may provide an unused flag signal UNUSED_FLAG based on the first bit FDATA<0> of the fuse data FDATA<0:b> during the boot-up operation. The unused flag signal UNUSED_FLAG may denote whether or not the corresponding latch set is used.

The latch-width adjusting circuit 200 may selectively couple the enable latch ENL to the first address latch AL1 in response to the boot-up completion signal BOOTUP_END and the unused flag signal UNUSED_FLAG.

Figure 4:
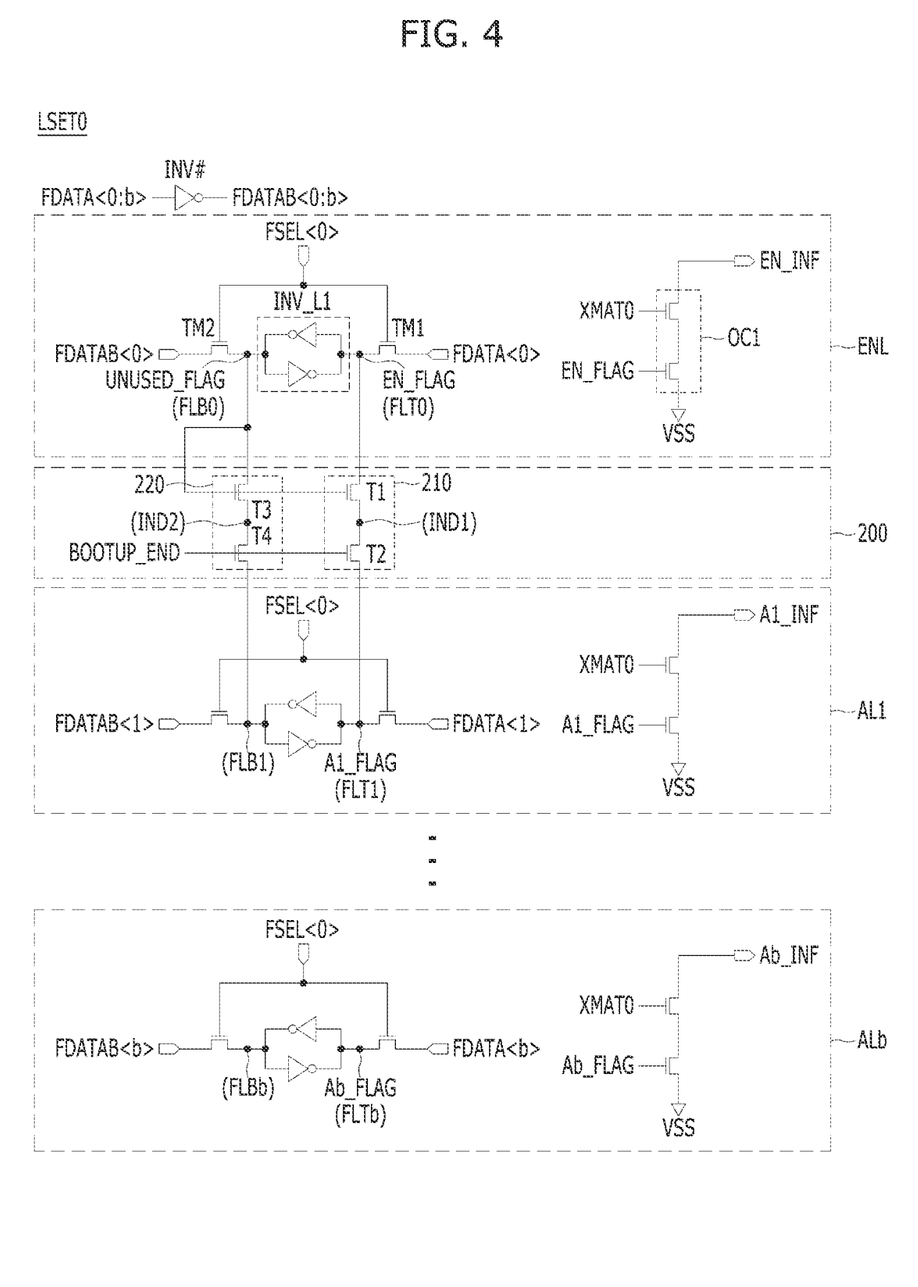
FIG. 4 is a circuit diagram illustrating a first latch set, such as that of FIG. 3.

FIG. 4 is a circuit diagram illustrating the first latch set LSET0 of FIG. 3.

Referring to FIG. 4, an arrangement in which the first latch set LSET0 is allocated to the first cell mat so as to operate according to a first mat activation signal XMAT0 is shown.

Referring to FIG. 4, the enable latch ENL may include a first transfer circuit TM1, a second transfer circuit TM2, an inverter latch INV_L1, and an output circuit OC1.

The first transfer circuit TM1 may transfer corresponding fuse data FDATA<0> to a first node FLT0, according to the first selection signal FSEL<0>. The first transfer circuit TM1 may be composed of a transistor which is coupled between a first input node where the fuse data FDATA<0> is inputted, and the first node FLT0, and turned on/off in response to the first selection signal FSEL<0>. The second transfer circuit TM2 may transfer inverted fuse data FDATAB<0> to a second node FLB0, according to the first selection signal FSEL<0>. The second transfer circuit TM2 may be composed of a transistor which is coupled between a second input node where the inverted fuse data FDATAB<0> is inputted, and the second node FLB0, and turned on/off in response to the first selection signal FSEL<0>. For reference, the first latch set LSET0 may further include inverters INV # for generating inverted fuse data FDATAB<0:b> by inverting the fuse data FDATA<0:b>.

The inverter latch INV_L1 may be coupled between the first node FLT0 and the second node FLB0. The inverter latch INV_L1 may invert a signal at the first node FLT0 to latch the inverted signal at the second node FLB0, and invert a signal at the second node FLB0 to latch the inverted signal at the first node FLT0. An enable flag signal EN_FLAG may be outputted from the first node FLT0, and the unused flag signal UNUSED_FLAG may be outputted from the second node FLB0. The inverter latch INV_L1 may be composed of cross-coupled inverters.

The output circuit OC1 may be coupled between a ground voltage (VSS) terminal and an output node, and output the enable information EN_INF according the first mat activation signal XMAT0 and the signal at the first node FLT0 (i.e., the enable flag signal EN_FLAG). The output circuit OC1 may drive the output node to a ground voltage (VSS) when the first mat activation signal XMAT0 and the enable flag signal EN_FLAG are enabled. The output circuit OC1 may be composed of transistors coupled in series between the ground voltage (VSS) terminal and the output node, and respectively turned on/off in response to the first mat activation signal XMAT0 and the enable flag signal EN_FLAG.

Since each of the address latches AL1 to ALb may have substantially the same configuration and operation as that of the enable latch ENL, detailed explanation of the address latches is omitted. The address latches AL1 to ALb may transfer corresponding fuse data FDATA<1:b> to first nodes FLT1 to FLTb, and transfer inverted fuse data FDATAB<1:b> to second nodes FLB1 to FLBb, according to the first selection signal FSEL<0>. The address latches AL1 to ALb may output the address information A1_INF to Ab_INF according the first mat activation signal XMAT0 and the respective signals (i.e., address flag signals A1_FLAG to Ab_FLAG) at the first nodes FLT1 to FLTb.

The latch-width adjusting circuit 200 may include a first connection circuit 210 and a second connection circuit 220.

The first connection circuit 210 may couple the first node FLT0 of the enable latch ENL to the first node FLT1 of the first address latch AL1, according to the boot-up completion signal BOOTUP_END and the unused flag signal UNUSED_FLAG. The first connection circuit 210 may include a first transistor T1 and a second transistor T2 coupled in series. The first transistor T1 may couple the first node FLT0 of the enable latch ENL to a first intermediate node IND1, according to the unused flag signal UNUSED_FLAG. The second transistor T2 may couple the first intermediate node IND1 to the first node FLT1 of the first address latch AL1, according to the boot-up completion signal BOOTUP_END.

The second connection circuit 220 may couple the second node FLB0 of the enable latch ENL to the second node FLB1 of the first address latch AL1, according to the boot-up completion signal BOOTUP_END and the unused flag signal UNUSED_FLAG. The second connection circuit 220 may include a third transistor T3 and a fourth transistor T4 coupled in series. The third transistor T3 may couple the second node FLB0 of the enable latch ENL to a second intermediate node IND2, according to the unused flag signal UNUSED_FLAG. The fourth transistor T4 may couple the second intermediate node IND2 to the second node FLB1 of the first address latch AL1, according to the boot-up completion signal BOOTUP_END.

When the first connection circuit 210 and the second connection circuit 220 are turned on, the first node FLT0 of the enable latch ENL is coupled to the first node FLT1 of the first address latch AL1, and the second node FLB0 of the enable latch ENL is coupled to the second node FLB1 of the first address latch ALL. Accordingly, since input/output nodes of the inverter latch INV_L1 of the enable latch ENL are coupled to input/output nodes of the inverter latch of the first address latch AL1 adjacent to the enable latch ENL, respectively, such arrangement has the effect of increasing the latch width.

By way of example, FIG. 4 shows that the latch-width adjusting circuit 200 includes both of the first connection circuit 210 and the second connection circuit 220, but the invention is not limited to that configuration. In another embodiment, the latch-width adjusting circuit 200 may include only one of the first connection circuit 210 and the second connection circuit 220.

Hereinafter, referring to FIGS. 1 to 4, an operation of the semiconductor memory device 100 in accordance with an embodiment is explained.

First, during a boot-up operation, the non-volatile memory 150 may output the programmed repair addresses as the fuse data FDATA<0:b> to the latch circuit 160, in response to the boot-up signal BOOTUP. At this time, the non-volatile memory 150 may provide the selection signal FSEL<0:a> together with the fuse data FDATA<0:b>, to the latch circuit 160. The latch circuit 160 may sequentially store the fuse data FDATA<0:b> provided from the respective fuse sets FSET0 to FSETa into the latch sets LSET0 to LSETa, according to the selection signal FSEL<0:a>.

For example, when the first selection signal FSEL<0> is enabled, the first transfer circuit (i.e., TM1) and the second transfer circuit (i.e., TM2) of the enable latch ENL and the address latches AL1 to ALb included in the first latch set LSET0, are turned on. Thus, the fuse data FDATA<0:b> are transferred to the first nodes FLT0 to FLTb, and the inverted fuse data FDATAB<0:b> are transferred to the second nodes FLB0 to FLBb. When the enable fuse EF is programmed by a high bit since the first fuse set FSET0 stores a valid repair address, the fuse data FDATA<0> becomes a signal of a logic high level, and thus the enable flag signal EN_FLAG of a logic high level may be generated, and the unused flag signal UNUSED_FLAG of a logic low level may be generated. On the contrary, in case where the enable fuse EF is programmed by a low bit since the first fuse set FSET0 stores an invalid repair address, the fuse data FDATA<0> become a signal of a logic low level, and thus the enable flag signal EN_FLAG of a logic low level may be generated, and the unused flag signal UNUSED_FLAG of a logic high level may be generated. That is, when the first fuse set FSET0 has been unused, the unused flag signal UNUSED_FLAG is generated with a logic high level.

By the above boot-up operation, the repair addresses programmed in the fuse sets FSET0 to FSETb of the non-volatile memory 150 may be transferred and stored in the latch sets LSET0 to LSETb of the latch circuit 160, respectively.

During a normal operation after the boot-up operation, when a word line disposed in a first cell may is selected, the first mat activation signal XMAT0 is enabled. The enable latch ENL of the first latch set LSET0 may output the enable information EN_INF according the enable flag signal EN_FLAG at the first node FLT0. Likewise, the address latches AL1 to ALb of the first latch set LSET0 may output the address information A1_INF to Ab_INF according the address flag signals A1_FLAG to Ab_FLAG at the first nodes FLT1 to FLTb. The repair control circuit 170 controls the row circuit 120 to perform a repair operation, according to the repair information INF_R provided from the latch circuit 160.

When the boot-up completion signal BOOTUP_END becomes enabled after the boot-up operation, the latch-width adjusting circuits 200 may couple the enable latch ENL to the adjacent address latch AL1 depending on whether or not the corresponding latch set is used. That is, according to the boot-up completion signal BOOTUP_END and the unused flag signal UNUSED_FLAG, the first connection circuit 210 may couple the first node FLT0 of the enable latch ENL to the first node FLT1 of the first address latch AL1, and the second connection circuit 220 may couple the second node FLB0 of the enable latch ENL to the second node FLB1 of the first address latch AL1. When the corresponding latch set is unused, the latch-width adjusting circuit 200 may couple the enable latch ENL to the first address latch AL1 adjacent to thereto, thereby increasing the physical width of the latch circuit 160. That is, in accordance with an embodiment, at the end of the boot-up operation, a neutron attack has been distributed due to an increase in the width of the unused latch sets, to thereby prevent the latch inversion and lower the NSER.

In an embodiment, one latch-width adjusting circuit 200 is disposed between the enable latch ENL and the adjacent address latch AL1 in each latch set, but the invention is not limited to that configuration. In another embodiment, two or more latch-width adjusting circuits may be disposed in each latch set.

Figure 5A:
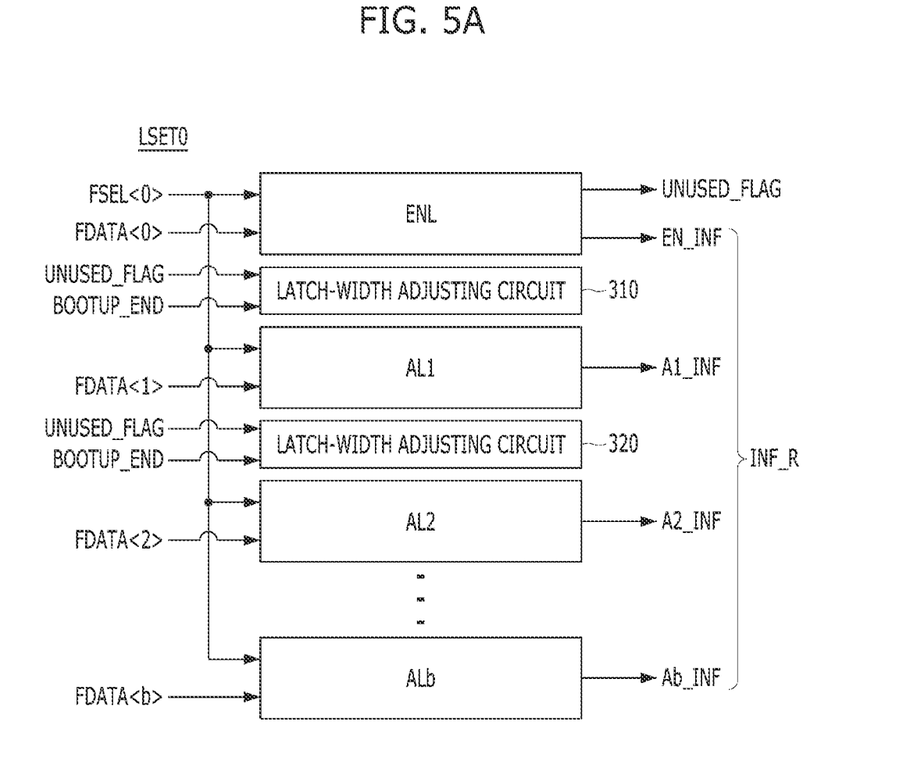
FIGS. 5A and 5B are block diagrams illustrating a latch circuit in accordance with another embodiment of the present invention.
Figure 5B:
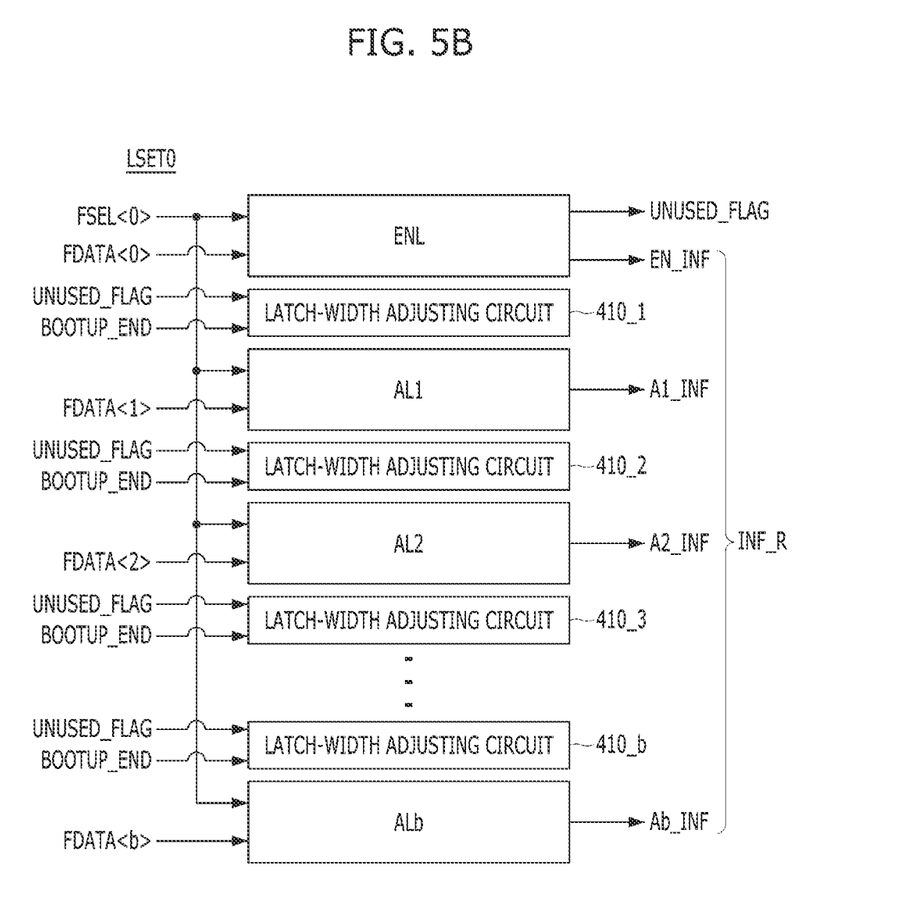

FIGS. 5A and 5B are block diagrams illustrating a latch circuit in accordance with another embodiment of the present invention. In FIGS. 5A and 5B, a first latch set LSET0 and latch-width adjusting circuits corresponding thereto are shown.

Referring to FIG. 5A, the latch circuit may include a first latch-width adjusting circuit 310 and a second latch-width adjusting circuit 320 corresponding to the first latch set LSET0. The first latch-width adjusting circuit 310 may be disposed between an enable latch ENL and a first address latch AL1, that is, the latch nearest to the enable latch ENL in the first latch set LSET0. The second latch-width adjusting circuit 320 may be disposed between the first address latch AL1 and a second address latch AL2, that is, the latch next nearest to the enable latch ENL in the first latch set LSET0. That is, by disposing two or more latch-width adjusting circuits 310 and 320 in each latch set, it is possible to further increase the width of the latch circuit.

Referring to FIG. 5B, the latch circuit may include a plurality of latch-width adjusting circuits 410_1 to 410_b corresponding to the first latch set LSET0. The latch-width adjusting circuits 410_1 may be disposed between the enable latch ENL and the first address latch AL1 of the first latch set LSET0. The remaining latch-width adjusting circuits, i.e., 410_2 to 410_b are disposed between respective adjacent pairs of address latches, as shown in FIG. 5B. By disposing a plurality of latch-width adjusting circuits 410_1 to 410_b in this manner, it is possible to further increase the width of the latch circuit despite of partial increase in area.

As described above, in accordance with embodiments of the present invention, by coupling an enable latch to at least one adjacent address latch when a corresponding latch set is unused, it is possible to increase the width of the latch circuit. Thus, a neutron attack is distributed due to an increase in the latch width, to thereby prevent the latch inversion and lower the NSER.

It should be noted that although the present invention has been described in connection with various embodiments thereof, such description is not intended to limit the invention. Those skilled in the art will appreciate that various changes may be made to any of the disclosed embodiments without departing from the technical spirit of the present invention.

For example, the logic gates and transistors provided as examples in the above-described embodiments may be of different types and configured differently, depending on the polarity of the input signal.

While the present disclosure has been described with respect to specific embodiments, the invention itself encompasses all changes and variations of any such embodiment that fall within the scope of the claims.

What is claimed is:

1. A latch circuit comprising:
    a plurality of latch sets, each including an enable latch and a plurality of address latches; and
    a plurality of latch-width adjusting circuits respectively corresponding to the latch sets, wherein, in each of the plurality of latch sets, the corresponding latch-width adjusting circuit is disposed between the enable latch of the corresponding latch set and the address latch adjacent to the enable latch, and couples the enable latch to the adjacent address latch depending on whether or not the corresponding latch set is used, at an end of a boot-up operation.

2. The latch circuit of claim 1,
    wherein, for each of the latch sets, the corresponding enable latch stores information on whether the corresponding latch set stores valid fuse data, and the address latches store a repair address.

3. The latch circuit of claim 1, wherein, for each of the plurality of latch sets, each of the enable latch and the address latches includes:
    a first transfer circuit suitable for transferring fuse data to a first node, according to a selection signal;
    a second transfer circuit suitable for transferring inverted fuse data to a second node, according to the selection signal;
    an inverter latch coupled between the first node and the second node; and
    an output circuit suitable for driving an output node according to a signal at the first node.

4. The latch circuit of claim 3, wherein, for each of the plurality of latch sets, each of the latch-width adjusting circuits includes:
    a first connection circuit suitable for coupling the first node of the enable latch to the first node of the adjacent address latch, according to a boot-up completion signal and a signal at the second node of the enable latch.

5. The latch circuit of claim 4, wherein the first connection circuit includes:
    a first transistor suitable for coupling the first node of the enable latch to a first intermediate node, according to the signal at the second node of the enable latch; and
    a second transistor suitable for coupling the first intermediate node to the first node of the adjacent address latch, according to the boot-up completion signal.

6. The latch circuit of claim 3, wherein each of the latch-width adjusting circuits includes:
    a second connection circuit suitable for coupling the second node of the enable latch to the second node of the adjacent address latch, according to a boot-up completion signal and a signal at the second node of the enable latch.

7. The latch circuit of claim 6, wherein the second connection circuit includes:
    a third transistor suitable for coupling the second node of the enable latch to a second intermediate node, according to the signal at the second node of the enable latch; and
    a fourth transistor suitable for coupling the second intermediate node to the second node of the adjacent address latch, according to the boot-up completion signal.

8. A semiconductor memory device comprising:
    a memory cell array including normal memory cells and redundant memory cells to replace repair target memory cells;
    a non-volatile memory including a plurality of fuse sets for programming repair addresses of the repair target memory cells, suitable for sequentially outputting fuse data programmed in the fuse sets in response to a boot-up signal;
    a latch circuit including a plurality of latch sets respectively corresponding to the fuse sets, suitable for storing the fuse data provided from the respective fuse sets into the latch sets, and outputting the stored fuse data as repair information while adjusting a width of unused latch sets among the latch sets in response to a boot-up completion signal; and
    a repair control circuit suitable for controlling a repair operation for replacing the repair target memory cells with the redundant memory cells, based on the repair information.

9. The semiconductor memory device of claim 8, wherein each of the latch sets includes:
    an enable latch suitable for storing information on whether the corresponding latch set stores valid fuse data; and
    a plurality of address latches suitable for storing the repair address in the fuse data.

10. The semiconductor memory device of claim 9, wherein the latch circuit includes:
    a plurality of latch-width adjusting circuits corresponding to the latch sets, wherein, in each of the plurality of latch sets, the corresponding latch-width adjusting circuit is disposed between an enable latch of the corresponding latch set and the address latch adjacent to the enable latch, and couples the enable latch to the adjacent address latch according to the boot-up completion signal and the information stored in the enable latch.

11. The semiconductor memory device of claim 10, wherein, for each of the plurality of latch sets, each of the enable latch and the address latches includes:
    a first transfer circuit suitable for transferring fuse data to a first node, according to a selection signal;
    a second transfer circuit suitable for transferring inverted fuse data to a second node, according to the selection signal;
    an inverter latch coupled between the first node and the second node; and
    an output circuit suitable for driving an output node according to a signal at the first node.

12. The semiconductor memory device of claim 11, wherein, for each of the plurality of latch sets, each of the latch-width adjusting circuits includes:

a first transistor suitable for coupling the first node of the enable latch to a first intermediate node, according to the signal at the second node of the enable latch;
a second transistor suitable for coupling the first intermediate node to the first node of the adjacent address latch, according to the boot-up completion signal;
a third transistor suitable for coupling the second node of the enable latch to a second intermediate node, according to the signal at the second node of the enable latch; and
a fourth transistor suitable for coupling the second intermediate node to the second node of the adjacent address latch, according to the boot-up completion signal.

13. The semiconductor memory device of claim 8, wherein the non-volatile memory includes any of an array e-fuse (ARE) circuit, a laser fuse circuit, a NAND flash memory, a NOR flash memory, a phase-change random access memory (PCRAM), a resistive random access memory (ReRAM), a ferroelectric random access memory (FeRAM), a magnetic random access memory (MRAM), and a spin transfer magnetic random access memory (STT-MRAM).

14. A latch circuit comprising:
a first latch suitable for transferring first data to a first node and inverted first data to a second node, in response to a selection signal that is enabled during a power-up operation, and latching data at the first and second nodes;
a second latch suitable for transferring second data to a third node and inverted second data to a fourth node, in response to the selection signal, and latching data at the third and fourth nodes; and
a latch-width adjusting circuit suitable for coupling the first node to the third node and coupling the second node to the fourth node, in response to the data at the second node and a boot-up completion signal that is enabled after the power-up operation.

15. The latch circuit of claim 14, wherein the first latch includes:
a first transfer circuit suitable for transferring the first data to the first node, according to the selection signal;
a second transfer circuit suitable for transferring the inverted first data to the second node, according to the selection signal; and
a first inverter latch coupled between the first node and the second node.

16. The latch circuit of claim 14, wherein the second latch includes:
a third transfer circuit suitable for transferring the second data to the third node, according to the selection signal;
a fourth transfer circuit suitable for transferring the inverted second data to the fourth node, according to the selection signal; and
a second inverter latch coupled between the third node and the fourth node.

17. The latch circuit of claim 14, wherein the latch-width adjusting circuit includes:
a first transistor suitable for coupling the first node to a first intermediate node according to the data at the second node;
a second transistor suitable for coupling the first intermediate node to the third node according to the boot-up completion signal;
a third transistor suitable for coupling the second node to a second intermediate node according to the data at the second node; and
a fourth transistor suitable for coupling the second intermediate node to the fourth node according to the boot-up completion signal.

18. A semiconductor memory device comprising:
a plurality of fuse sets suitable for programming repair addresses of repair target memory cells as fuse data and outputting the fuse data in each fuse set, in response to a boot-up signal;
a plurality of latch sets, each latch set corresponding to each fuse set and suitable for receiving and storing fuse data from the corresponding fuse set and outputting the stored fuse data as repair information; and
a repair control circuit suitable for controlling a repair operation on the repair target memory cells based on the repair information,
wherein each latch set includes:
an enable latch suitable for storing information indicating whether the latch set stores valid fuse data;
a plurality of address latches including a first address latch adjacent to the enable latch and remaining address latches in parallel, suitable for storing the fuse data; and
a latch-width adjusting circuit suitable for coupling the enable latch and the first address latch when the latch set is unused and a boot-up completion signal is enabled.

* * * * *